(12) United States Patent
Yoshimoto et al.

(10) Patent No.: US 7,890,898 B2
(45) Date of Patent: Feb. 15, 2011

(54) METHOD FOR SEMICONDUCTOR CIRCUIT

(75) Inventors: Hiroyuki Yoshimoto, Kawasaki (JP);
Nobuyuki Sugii, Tokyo (JP); Shinichi Saito, Kawasaki (JP); Digh Hisamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 320 days.

(21) Appl. No.: 12/024,107

(22) Filed: Jan. 31, 2008

(65) Prior Publication Data

US 2009/0132974 A1 May 21, 2009

(30) Foreign Application Priority Data

Nov. 21, 2007 (JP) ............... 2007-301276

(51) Int. Cl.
*G06F 17/50* (2006.01)
(52) U.S. Cl. .............................. 716/4; 716/2
(58) Field of Classification Search ...... 716/1, 716/4–6, 2
See application file for complete search history.

(56) References Cited

U.S. PATENT DOCUMENTS

| | | | |
|---|---|---|---|
| 7,000,201 B2 * | 2/2006 | Hayashi | 716/4 |
| 7,642,567 B2 * | 1/2010 | Amasuga et al. | 257/194 |
| 2006/0107246 A1 * | 5/2006 | Nakamura | 716/5 |

OTHER PUBLICATIONS

Takagi et al., "On the Universality of Inversion Layer Mobility in Si MOSFET's: Part I—Effects of Substrate Impurity Concentration" IEEE Transactions on Electron Devices, vol. 41, pp. 2357-2362, 1994.
K.K. Schroder "Semiconductor Material and Device Characterization $2^{nd}$ Edition" Wiley-Interscience Publication, John Wiley & Sons Inc, p. 541 (1998).
Saito et al., "Analytical Quantum Mechanical Model for Accumulation Capacitance of MOS Structures", IEEE Electron Devices Letters, vol. 23, No. 6, pp. 348-350, 2002.
Ando et al., "Electronic Properties of 2D Systems", Rev. Mod. Phys., vol. 54, No. 2, pp. 461-466, 1982.
Ge et al., "Analytical Modeling of Quantization and Volume Inversion in Thin Si-Film DG MOSFETs", IEEE Transactions on Electron Devices, vol. 49, No. 2, pp. 287-294, 2002.

* cited by examiner

*Primary Examiner*—Jack Chiang
*Assistant Examiner*—Binh C Tat
(74) *Attorney, Agent, or Firm*—Miles & Stockbridge P.C.

(57) ABSTRACT

Capacity-gate voltage characteristics of a field-effect transistor having plural gates are measured against a voltage change in each one of the gates for an inverted MOSFET and for an accumulated MOSFET, respectively. These measurements together with numerical simulations provided from a model for quantum effects are used to determine flat band voltages between the plural gates and a channel. Next, an effective normal electric field is calculated as a vector line integral by using a set of flat band voltages for the measured capacity as a lower integration limit. Lastly, mobility depending on the effective normal electric field is calculated from current-gate voltage characteristic measurements and capacity measurements in a source-drain path, and the calculated mobility is substituted into an equation for a current-voltage curve between source and drain.

4 Claims, 13 Drawing Sheets

METHOD FOR SEMICONDUCTOR CIRCUIT

CLAIM OF PRIORITY

The present application claims priority from Japanese application JP 2007-301276, filed on Nov. 21, 2007, the content of which is hereby incorporated by reference into this application.

BACKGROUND OF THE INVENTION

1. Field of the Invention

The present invention relates in general to a design method for a semiconductor circuit, more specifically, to a design method for a semiconductor circuit characterized by a field-effect transistor having plural gate electrodes to extract characteristics of a circuit which the transistor is mounted on.

2. Background of the Related Arts

In development of semiconductor devices such as LSIs, circuit simulation is an important process to achieve a shortened development period by predicting characteristics of a circuit prior to prototype production. In a traditional standard circuit simulation, current-voltage characteristics of a transistor, a primary circuit-constituent element, have been described in use of a simple model which is not based on a physical model. BSIM (Berkeley Short-Channel IGFET Model) is one of typical examples thereof. As to this model, however, many expect that the number of device parameters required for accurate reproduction of circuit operations in simulation would have to increase every year to keep abreast with micronization of LSI and complication of processes, and it will also become more difficult to make model parameters coincide exactly with device parameters. Under these circumstances, a new circuit simulation model, which is built based on a transistor physical model represented by HiSIM (Hiroshima-University STARC IGFET Model), has recently been suggested. Current (I) flowing between source and drain of a transistor similar to the ones shown in FIG. 3 and FIG. 4 (hereinafter referred to as MOSFET, Metal Oxide Semiconductor Field Effect Transistor) in such a model in general is determined through multiplication of charge density by mobility of an inversion layer at a gate surface as follows:

$$I = \frac{W}{L} \int_0^{V_{ds}} \mu(V) Q_{inv}(V) dV \quad (1)$$

where, L and W indicate length and width as shown in FIG. 4, and $V_{ds}$ indicates a voltage between source and drain. In Equation (1), mobility ($\mu(V)$) is one of device parameters determining current characteristics of a circuit simulator, and is determined by the effect of scattering in electrons or holes inside an inversion layer.

Scattering mechanisms determining a value of the mobility can be classified according to their causes. Examples of major causes include an oscillation of channel-constituent atoms, interactions with channel impurities, and roughness at the gate surface, which are respectively called phonon scattering, Coulomb scattering, and (surface) roughness scattering.

Their contributions to the mobility follow Matthiessen's rule expressed as follows:

$$1/\mu = 1/\mu_{ph} + 1/\mu_{imp} + 1/\mu_{rs} \quad (2)$$

where, $\mu$ is measured mobility, and $\mu ph$, $\mu imp$, and $\mu rs$ are respectively mobilities provided that phonon scattering, Coulomb scattering, and roughness scattering are only dominant scattering mechanisms.

Under a certain temperature, phonon scattering maintains a constant level, but Coulomb scattering varies depending on the impurity density in a channel and the charge density of an inversion layer. Meanwhile, roughness scattering is caused by interactions between a gate surface and an inversion layer charge, and varies in magnitude (or level) according to individual manufacturing processes such as material of a gate oxide film, state of surface, etc. Therefore, when the roughness scattering is introduced as a device parameter to a circuit simulator, it is vital and indispensable to extract the roughness scattering dependency on devices by all kinds of manufacturing processes.

The following will now explain how to extract roughness scattering limited mobility.

The roughness scattering limited mobility is influenced by interactions between the inversion layer charge and the gate/oxide interface, so it varies depending on a distance between charge center of the inversion layer and a gate insulating film. This distance also varies by an electric field in a direction normal to the gate insulating film. Therefore, for a bulk MOSFET similar to the ones shown in FIGS. 3 and 4, the dependency of mobility on scattering mechanisms is evaluated by means of a drawing or a graph having intensities of a so-called effective normal electric field ($E_{eff}$) plotted along its axis. Here, the effective normal electric field can be expressed in terms of $Q_{dep}$, $Q_{inv}$, and $\in_{si}$ as follows:

$$E_{eff} = (\eta Q_{inv} + Q_{dep})/\in_{si} \quad (3)$$

where $Q_{dep}$ is a charge density of a depletion layer in a channel, $Q_{inv}$ is a charge density of an inversion layer, and $\in_{si}$ is a dielectric constant of silicon.

Also, $\eta$ is defined to ½ for an NMOSFET, and ⅓ for a PMOSFET.

Further, mobility may be evaluated by using a value of a linear area where $V_{ds}$, which is called effective mobility $$\mu_{eff} = \frac{LI}{W Q_{inv} V_{ds}} \quad (4)$$

in Eq. (1), is proportional to a current vale.

Generally, an effective electric field has a value between about 0 MV/cm and 1 MV/cm. In a high electric field close to 1 MV/cm, the charge density in an inversion layer increases, and the center of charge in the inversion layer draws near to the gate surface. As Coulomb scattering gets weaker by electric shielding effects, roughness scattering becomes dominant compared to Coulomb scattering. In related to this, there has been a report in IEEE Transactions on Electron Devices, vol. 41, p 2357, 1994, for example, with regard to a bulk transistor of various channel impurities with different concentrations from each other, asserting that, under a certain temperature, a envelope is drawn if mobility is plotted as a function of $E_{eff}$, being overlapped in a high electric field.

Since this envelope has a fixed value being independent of gate electric thickness or impurity concentration of individual devices, it is called a universal mobility curve. Thus, a device parameter of roughness scattering is determined by extracting this curve.

Other terms like $Q_{inv}$ in Eq. (1) and $Q_{dep}$ in Eq. (3) for a bulk transistor are determined by equations explained, for example, in K. K. Schroder "Semiconductor Material and Device Characterization $2^{nd}$ Edition" Wiley-Interscience Publication, John Wiley & Sons Inc, pp. 541 (1998), in which an inversion layer capacity $C_{inv}$ and an accumulation layer capacity $C_{acc}$ having been obtained through a split-CV method are substituted $$Q_{inv} = \int_{-\infty}^{V} C_{inv} dV \quad (5)$$

$$Q_{dep} = \int_{V_{fb}}^{V} C_{acc} dV \quad (6)$$

as follows:

where V indicates a gate voltage impressed to a transistor, and $V_{fb}$ (called a flat band) is defined as a voltage at which the charge density of a channel becomes 0 (null).

SUMMARY OF THE INVENTION

The following will now presents a brief explanation on the summary of an exemplary embodiment of the present invention.

Since it is customarily impossible to derive an effective normal electric field from a transistor similar to the one shown in FIGS. 5 to 8, which has a plural number of gate electrodes, by adopting the same method used in a bulk transistor, evaluation of the dependency of mobility on the effective normal electric field was somewhat difficult. Accordingly, no body has yet discovered a method for extracting a roughness scattering device parameter in such a transistor.

There are actually two reasons for that. First, if a channel section in a transistor with plural gates is isolated by a substrate and an insulating film, holes are not formed so one cannot measure an accumulation-layer capacity. Second, because there are many gates, if one wants to fix a certain gate voltage and then change another gate voltage or plural gate voltages at the same time, it is not apparent how to perform integrations corresponding to Eq. (5) and Eq. (6), and how to set a lower integration limit in Eq. (6), i.e., a flat band voltage.

Therefore, the present invention is devised to provide a solution for the above-described problems, and a method for extracting a device parameter in respect to roughness scattering even from an ordinary transistor having plural gates to build the extracted device parameter in a circuit simulator. Further details will be provided in a description henceforth.

It is an object of the present invention to provide a device parameter for surface roughness of a transistor having plural gates. The above and other objects and novel features of the present invention will become apparent from a description of the present specification taken in conjunction with the accompanying drawings.

The following will now explain how to extract a roughness scattering device parameter at the surface of every gate insulating film in a transistor having N gate electrodes as shown in FIG. 9.

This transistor has N+1 charge storage sites in the vicinity of gate electrodes and channels. In addition, charge in each site changes to a function of gate voltage at N sites, respectively. Further, because an electric field at the surface of a gate is usually unique and different from the others, definition of an effective normal electric field of a bulk transistor expressed by Eq. (1) is expanded to an effective normal electric field at the surface of an individual gate.

When a charge density at a gate electrode in a bulk transistor is $Q_1$, $Q_1+Q_{inv}+Q_{dep}=0$ by the charge conservation law. Therefore, Eq. (3) can be rewritten as follows:

$$E_{eff} = (-Q_1 - (1-\eta)Q_{inv})/\in_{si} \quad (7)$$

By expanding definition of the Eq. (7), an effective normal electric field at the surface of each one of gates is defined.

First of all, numbers from 1 to N are given to all gates, and a charge density at the j-th gate and an inversion layer charge density induced to the surface of the j-th gate are denoted as $Q_j$ and $Q_{inv}{}^j$, respectively. Here, an effective normal electric field at the surface of the j-th gate is defined as follows:

$$E_{eff}{}^j = (-Q_j - (1-\eta)Q_{inv}{}^j)/\in_{si} \quad (8)$$

In Eq. (8), the term η is defined as same as a bulk transistor.

Next, a method for calculating charge at each one of gate electrodes and an inversion layer charge density at the surface of a gate insulating film in Eq. (5) is explained.

Suppose $V_j$ denotes a gate voltage at a gate, $V_0$ denotes a source/drain voltage, and $Q_0$ denotes a charge density inside a channel. Then, a set of source, drain and gate voltages may be expressed in terms of vectors as follows:

$$\vec{V} = (V_0, V_1, V_2, \ldots, V_n) \quad (9)$$

In general, voltage ($V_0$) at source/drain electrodes is 0V. Charge measurement is available, given that a limited voltage value is supplied to the source and drain electrodes. This method will be explained later.

As used in a bulk transistor, capacity measurements are utilized to calculate a charge at each gate electrode and an internal charge of a channel. Capacity of the j-th gate electrode of a transistor having N gate electrodes is first explained. Since capacity refers to a change in charge under varying voltage, a measured capacity at a channel or at each gate by varying voltage, $\forall i$ ($j \leq i \leq n$), at the j-th gate electrode would be expressed henceforth as follows:

$$\frac{\partial Q_j(\vec{V})}{\partial V_i} (0 \leq j \leq n) \quad (10)$$

given that the other gate voltages except for the j-th gate voltage is fixed to a constant value.

Capacity is obtained by measurement of a current change in a target terminal. That is, a terminal to be measured is designated as a Low terminal, and a terminal subjected to a change in potential is designated as a High terminal. Also, if i=j≠0, High terminal and Low terminal are the same. In this case, the following equation is obtained complying with the charge conservation law $$\sum_{j=0}^{n} Q_j = 0 \quad (11)$$

which equation is then differentiated in terms of $V_i$ to obtain another equation as follows:

$$\frac{\partial Q_i(\vec{V})}{\partial V_i} = -\sum_{\substack{j=0 \\ j \neq i}}^{n} \frac{\partial Q_j(\vec{V})}{\partial V_i} \quad (12)$$

so that a measured value on the right side of the equation can be used.

That is, if j=0 in Eq. (10), capacity between gate and channel is measured using the same method as the capacity of a gate electrode, in which all voltages except for the j-th gate voltage are fixed to a constant voltage. In addition, if $V_j$ is varied while the other voltages have a constant value, an inversion layer or an accumulation layer is formed on the interface of an i-th gate in presence of a sufficiently large voltage in positive or negative direction. Therefore, in the description below, it is assumed that an inversion layer or an accumulation layer is formed on the interface of the i-th gate. Particularly, reference numeral _ denotes the inversion layer or the accumulation layer formed on the interface of the i-th gate.

As has been described so far, capacity measurement is done based on an assumption that the source-drain voltage is 0V. Normally, in electromagnetism, voltage has a meaning only as a variable quantity with respect to a specific reference value, so a voltage value at each gate electrode in Eq. (9) can be analyzed as a relative value to the sour-drain voltage. Therefore, the state inside the transistor at a voltage value defined by Eq. (9) is as same as the state expressed by the following equation, $$Q_j(V_0+X, V_1+X, \ldots, V_j+X, \ldots, V_n+X) = Q_j(V_0, V_1, \ldots, V_j, \ldots, V_n) \quad (13)$$

where a constant voltage is applied to each component of a vector.

Thus, when a voltage $V_j$ is impressed to the j-th gate to measure capacity of the j-th gate as a Low terminal according to split-CV based measurement, it becomes possible to measure capacity that is equivalent to a state applying a finite voltage to the j-th electrode. Further, by differentiating Eq. (13) in terms of X, the left side of Eq. (12) can be rewritten as follows:

$$\frac{\partial Q_i(\vec{V})}{\partial V_i} = -\sum_{\substack{j=0 \\ j \neq i}}^{n} \frac{\partial Q_i(\vec{V})}{\partial V_j} \quad (14)$$

which includes capacity under a variable $V_0$.

In addition to Eq. (12) and Eq. (14), another relation is obtained by Green's reciprocity theorem in electrostatic magnetics as follows:

$$\frac{\partial Q_j(V_0, V_1, V_2)}{\partial V_i} = \frac{\partial Q_i(V_0, V_1, V_2)}{\partial V_j} (i, j = 0, 1, 2) \quad (15)$$

Charge density is calculated by integrating capacity obtained by Eq. (10). In order to calculate charge at each gate electrode or at channel, it is necessary to select a set of voltages for making charge density 0 (null) at a lower integration limit. This voltage is determined depending on diverse factors such as channel structure and soon. Generally, when a voltage corresponding to the work function difference between gate and channel is impressed to each one of gates, change density at the channel and at every gate electrode becomes 0 (null). This voltage is defined as a flat band voltage of a transistor having plural gates. The flat band voltage can be obtained by comparing a measured capacity for an accumulation layer with a calculated capacity for an accumulation layer, which capacity is obtained by a numerical calculation method (to be explained later). Also, two kinds of test devices, i.e., an accumulated transistor and an inverted transistor, are prepared as transistors for which channels like the ones shown in FIGS. 5, 6 and 8 are not in direct contact with a substrate and the substrate is isolated by an insulating film. Capacity measurement is carried out by using these two kinds of transistors. For example, accumulation-layer capacity is measured by using the accumulated transistor, while the other capacities are measured by the inverted transistor.

Next, a calculation method of charge density inside a channel and each one of gates is explained. Suppose that there is a transistor having n transistors, and each gate voltage is expressed as follows:

$$\vec{V}_G = (0, V_{G1}, V_{G2}, \ldots, V_{Gn}) \quad (16)$$

Then, charge ($Q_j$) at the j-th gate electrode is calculated by the following equation:

$$Q_j(\vec{V}_G) = \sum_{k=1}^{N} \int_{V_{FBk}}^{V_{Gk}} dV_k \frac{\partial Q_j(0, V_{G1}, V_{G2}, \ldots, V_k, V_{FB(k+1)}, V_{FB(k+2)}, \ldots, V_{FBn})}{\partial V_k} \quad (17)$$

where a flat band voltage is defined as follows:

$$\vec{V}_{FB} = (0, V_{FB1}, V_{FB2}, V_{FB3}, \ldots, V_{FBn}) \quad (18)$$

Also, a source-drain voltage is always 0.

This formula corresponds to a measurement and calculation step, which is going to be explained henceforth. All voltages except for $V_1$ are fixed to a flat band voltage, so as to integrate capacity in Eq. (5) with integration limits varying from $V_{FB1}$ to $V_{G1}$ for $V_1$. Next, $V_1$ is fixed to $V_{G1}$, and $V_3$ to $V_{n1}$ are fixed to a flat band voltage, so as to integrate capacity in Eq. (5) with integration limits varying from $V_{FB1}$ to $V_{G2}$ for $V_2$. This work continues until 'n' integrated values are obtained. All of them are summed up to give $Q_j$ (vector $V_G$).

The integration having been explained in Eq. (9) is the same as the integration on a random curve that connecting vector $V_{FB}$ and vector $V_G$ in an n-dimensional space.

Meanwhile, $Q_{inv}^j$ (vector $V_G$) is calculated as follows:

$$Q_{inv}^j(\vec{V}_G) = \int_{V_{min}}^{V_{Gj}} \frac{\partial Q_0}{\partial V_j} dV_j \quad (19)$$

Here, if a MOSFET is involved, the lower integration limit $V_{min}$ has a value sufficiently lower than a given threshold voltage, but if a PMOSFET is involved, the lower integration limit $V_{min}$ has a value sufficiently higher than a given threshold voltage.

The obtained charges for channel and each gate are substituted into Eq. (8) to get an effective normal electric field ($E_{eff}^j$ (vector $V_G$)) for the j-th gate. With this effective normal electric field as a horizontal axis, mobility under the j-th gate electrode having an inversion layer formed thereon is plotted against various values of other gate electrodes. Then, plural mobility curves draw a parabola from which a roughness scattering device parameter is extracted.

Lastly, the following will now explain how to determine a flat band voltage of a transistor having plural gates with those numerical calculation results.

Capacity at the j-th gate of a transistor having 'n' gates is calculated by computing charge inside a channel and charge at each one of gate electrodes. Depletion effect is considered for gate electrodes, and quantum effect is incorporated for charge distribution in the channel. The importance of incorporating the quantum effect to an inversion layer or an accumulation layer in the channel of a minute transistor has already been mentioned in many literatures such as IEEE Electron Devices Letters, vol. 23 p. 348, 2002. For the easier computation on the depletion effect at the gate block, a method based on classical statistical dynamics obeying the Maxwell-Boltzmann statistics is applied. Charge density inside the channel can be obtained by solving the Schrödinger equation and the 2-dimensional Poisson's equation simultaneously or self-consistently. This simultaneous differential equation is a high dimensional non-linear equation, so it is actually very difficult to solve, but it is going to be solved by using approximation with calculus of variations (to be explained) here.

First, for a transistor having 'n' gates, a section normal to the source-drain direction in a channel region is shown on a coordinate grid with x and y axes as shown in the drawings, and a boundary zone between a channel of the j-th gate and a gate insulating film is indicated by $A_j$, and a channel region is indicated by $A_0$. Further, suppose that an intersection between $A_j$ and $A_{j+1}$ is $(x_j, y_j)$. Then, $A_j$ can be expressed by the following equation. In addition, suppose that unit of the following has become dimensionless by using a proper constant, e.g., a maximum inter-gate distance.

$$A_j = \{(x,y) | a_j x + b_j y + c_j = 0, x_{j-1} \leq x \leq x_j, y_{j-1} \leq y \leq y_j\} \quad (20)$$

Here, $A_0$ denotes an area surrounded by $A_j$. Moreover, suppose that voltage $V_{Gj}$ is applied to the j-th gate electrode. Having assumed a charge value $\forall j$ ($1 \leq j \leq n$) at each gate electrode for the first time, one can solve Poisson's equation as set forth below.

To begin with, an electrostatic potential is decomposed into contribution from a charge in a channel region, ($\phi_1(x,y)$), and contribution from a charge at a gate electrode, ($\phi_2(x,y)$), according to the principle of superposition.

$$\phi(x,y) = \phi_1(x,y) + \phi_2(x,y) \quad (21)$$

Contribution from the former is given by Poisson's equation below:

$$\left(\frac{\partial^2}{\partial x^2} + \frac{\partial^2}{\partial y^2}\right)\varphi_1(x,y) = \rho(x,y), (x,y) \in A_0 \quad (22)$$

$$\varphi_1(x,y) = 0, (x,y) \notin A_0$$

where $\rho(x, y)$ is a charge density inside a channel, and constituted by the contribution from a depletion charge at an excited impurity state in silicon and from a carrier of an inversion layer or an accumulation layer.

Integral of the above equation is given below:

$$\varphi_1(x,y) = \frac{1}{2\pi\varepsilon_{si}} \int\int_{A_0} \rho(x', y')\log(r' + \delta) dx' dy' \quad (23)$$

$$r' = \sqrt{(x-x')^2 + (y-y')^2}$$

where δ is a positive infinitesimal, and takes a limit δ→0 after all computations are finished. For real numerical integration, it preferably has a value smaller than a distance between lattice points, assuming that the space has been discretized.

On the other hand, the latter equation is given by Laplace equation below:

$$\left(\frac{\partial^2}{\partial x^2} + \frac{\partial^2}{\partial y^2}\right)\varphi_2(x,y) = 0, (x,y) \in A_0 \quad (24)$$

$$\varphi_2(x,y) = -V_{Gj} + \varphi_s^j + \frac{t_{oxj} Q_j}{\varepsilon_{OX}} \equiv \varphi_{A_j}(x,y), (x,y) \in A_j (j \neq 0)$$

where $V_{Gj}$ is a gate voltage at the j-th gate, and $t_{oxj}$ is a gate oxide thickness of the j-th gate. Moreover, $\phi_s^j$ is an amount of band bending by gate depletion effects on a gate electrode, which is determined by Eq. (25) or Eq. (26) as follows:

$$Q_j = \text{sgn}(\varphi_s) \quad (25)$$

$$\sqrt{2\varepsilon_{si} kT N_{imp}} \left[\left(e^{-\frac{q\varphi_s^j}{kT}} + \frac{q\varphi_s}{kT} - 1\right) + \frac{n_i^2}{N_{imp}^{j2}}\left(e^{\frac{q\varphi_s^j}{kT}} - \frac{q\varphi_s^j}{kT} - 1\right)\right]^{\frac{1}{2}}$$

$$Q_j = \text{sgn}(\varphi_s) \quad (26)$$

$$\sqrt{2\varepsilon_{si} kT N_{imp}} \left[\left(e^{\frac{q\varphi_s^j}{kT}} - \frac{q\varphi_s}{kT} - 1\right) + \frac{n_i^2}{N_{imp}^{j2}}\left(e^{-\frac{q\varphi_s^j}{kT}} + \frac{q\varphi_s^j}{kT} - 1\right)\right]^{\frac{1}{2}}$$

where k is Boltzmann's constant, T is temperature, and $n_i$ is intrinsic carrier density of silicon or impurity concentration at the j-th gate electrode ($N_{jimp}$). Eq. (25) is used for a p-type semiconductor, and Eq. (26) is used for an n-type semiconductor. Also, when a gate electrode, being a metal, does not exhibit a depletion effect, $\phi_s^j = 0$ in Eq. (24).

Eq. (24) is a boundary problem of a 2-dimensional Laplace equation that is well known as a Dirichet problem, and can be written as an integral as follows:

$$\varphi_2(x,y) = \text{Re}\left[\frac{1}{2\pi i}\sum_{j=1}^{n}\int_{A_j} dw \frac{\varphi_{A_j}(x,y)}{w - x - iy}\right] \quad (27)$$

where 'i' stands for the imaginary unit. Suppose that integration of the equation is executed in a complex plane with y-axis representing an imaginary axis.

Next, a method for calculating charge density at an inversion layer or an accumulation layer incorporating the quantum effect is explained. A wave function for electron in the inversion layer or for hole in the accumulation layer of a channel region obeys Schrodinger equation as follows:

$$H\psi(x,y) = E\psi(x,y) \quad (28)$$

$$H = -\hbar^2\left(\frac{1}{m_{xx}}\frac{\partial^2}{\partial x^2} + \frac{1}{m_{yy}}\frac{\partial^2}{\partial y^2} + \frac{2}{m_{xy}}\frac{\partial^2}{\partial x \partial y}\right) \pm q\varphi(x,y)$$

where $m_{xy}$, $m_{xx}$, and $m_{yy}$ are called effective mass tensors of a silicon electron or hole in a normal direction to the source-drain. Their specific values vary depending on a plane orientation of silicon. Representative plane orientation values are provided, for example, in Rev. Mod. Phys., Vol. 54, p. 461, 1982.

Further, h stands for Planck's constant, and q stands for an elementary charge (or elementary electric charge).

In addition, sign for an electrostatic potential in the equation is positive (+) for an electron and negative (−) for a hole. Because the equation is a 2-dimensional non-linear differential equation, it is difficult to solve numerically. Thus, an easy calculation method needs to be employed for such a numerical calculation.

The electron/hole wave function may be solved by calculus of variations, instead of directly solving the Schrodinger equation. Variation of the wave function uses Eq. (28), which is also known as the Fang-Howard wave function, having expanded a wave function used in an analysis of the inversion layer distribution in a bulk transistor. A technique itself for determining charge at an inversion layer of a MOSFET is well known. For example, Rev. Mod. Phys., Vol. 54, p. 466, 1982 describes in detail how to calculate CV characteristics of a bulk MOSFET using Fang-Howard wave function.

$$\psi(x, y) = \begin{cases} A \prod_{j=1}^{n} x_j \sum_{j=1}^{n} e^{-\lambda_j x_j}, & (x, y) \in A_0 \\ 0, & (x, y) \notin A_0 \end{cases} \quad (29)$$

where $x_j$ in Eq. (28) is a distance in a normal direction to from the j-th gate interface to another gate interface, and can be written as follows:

$$x_j = \left| \frac{a_j x + b_j y + c_j}{\sqrt{a^2 + b^2}} \right| \quad (30)$$

$$\int_{A_0} |\psi(x, y)|^2 \, dxdy = 1 \quad (31)$$

In addition, A is a normalization constant, which is determined to satisfy the following condition:

Moreover, $\lambda_j$ (j=1, 2, , , n) is a variation parameter which controls charge quantity in an inversion layer or an accumulation layer in the vicinity of the j-th gate interface, and is determined by minimizing a given electron or hole energy (E) as follows:

$$E = \int_{A_0} dxdy \psi^*(x,y) H \psi(x,y) \quad (32)$$

In general, if the number of variation parameters increases, computation takes longer and a distinct energy minimum is more difficult to calculate. When an inversion layer or an accumulation layer is formed mainly at the j-th gate interface, it means $\lambda_j \gg \lambda_k (k \neq j)$. Therefore, to determine an energy minimum by approximation, parameters except for $\lambda_j$ are first set to 0, so that the energy for $\lambda_j$ may be minimized. Next, under a fixed $\lambda_j$, variation parameters ($\lambda_j-1, \lambda_j-1$) for charge density around interface regions of the (j−1)th and (j+1)th gates adjacent to the j-th gate are changed, and $\lambda_j$ is changed later.

Charge density at an inversion layer or an accumulation layer induced into a channel is obtained by individually calculating charge density being induced to each one of gates. Electron density ($Q_{inv}^j$) in an inversion layer and hole density ($Q_{acc}^j$) in an accumulation layer induced into the j-th gate are given as follows:

$$Q_{inv}^j = \frac{4\pi kT}{h^2} \sum_i g_i M_i \log\left[-\frac{E_c - E_f - E}{kT}\right] \quad (33)$$

-continued $$Q_{acc}^j = \frac{4\pi kT}{h^2} \sum_i g_i M_i \log\left[-\frac{E_f - E_v - E}{kT}\right] \quad (34)$$

$$M_i = \sqrt{\frac{m_x^i m_y^i m_{xy}^{i2}}{m_{xy}^{i2} - m_x^i m_y^i}} \quad (35)$$

where 'i' denotes an electrostriction limit level index, and $m_x^i$, $m_y^i$, and $m_{xy}^i$ are electron or hole effective masses at the i-th electrostriction limit level. Also, only an energy level of the lowest subband is considered. Eq. (33) and Eq. (34) are for an n-type transistor. In case of a p-type transistor, Eq. (33) defines charge density at an accumulation layer, and E. (34) defines charge density at an inversion layer. Moreover, $E_c$ and $E_v$ are energies at contact points between conduction and valence bands of silicon and bandgaps, respectively.

Provided $N_{imp}$ is an impurity concentration in a channel, charge density is given by the following formula:

$$\rho(x,y) = N_{imp} + Q|\psi(x,y)|^2 \quad (36)$$

where Q stands for an electron or hole charge density. Also, $Q_0 = N_{imp} + Q$, provided S is an area of a region $A_0$.

Lastly, an induced electrostatic potential based on $Q_j$ that was assumed at first is used to calculate a quantity ($Q'_j$) as follows:

$$Q'_j = \epsilon_s \int_{A_j} dl |\vec{n} \cdot \vec{E}_j| \quad (37)$$

Here, integration is carried out in terms of $A_j$, using ($X_j-1$, $y_j-1$) as a start point and ($X_j, y_j$) as an end point. A vector (n), which is a unit vector normal to $A_j$, can be expressed as follows:

$$\vec{n} = \frac{(a_j, b_j)}{\sqrt{a_j^2 + b_j^2}} \quad (38)$$

Further, a vector (Ej), which is an electric field vector on $A_j$, can be defined as follows:

$$\vec{E} = -\left(\frac{\partial \varphi}{\partial x}, \frac{\partial \varphi}{\partial y}\right), (x, y) \in A_j \quad (39)$$

In the above formulas, $Q'_j = Q_j$, complying with the 2-dimensional Gauss law. Accordingly, if $Q'_j \neq Q_j$ for a certain j, an input value of $Q_j$ needs to be changed and the calculations explained above are executed again. The calculations are ended if a target value falls within an error allowable range.

Normally, a transistor to be measured has a vector component with a non-zero flat band voltage due to the work function difference between gate electrode and channel. However, the numerical calculations having been explained above make a flat band voltage (this corresponds to each gate voltage, $V_j (1 \leq j \leq n)$) zero. Therefore, a flat band voltage is determined through comparison between a calculated capacity and a capacity value that is obtained by parallelly shifting a measured capacity by a given voltage. In detail, a calculated value for capacity ($\partial Q_0(0, 0, , , , V_j, , , , 0)/\partial V_j$) in an accumulation layer of the j-th gate electrode, which is obtained after assuming all voltages except for the j-th one are 0, is compared with an actual measurement value for capacity ($C_{acc}^j(V_1, V_2, , ,$ $V_n$)) in an accumulation layer of the j-th gate electrode under varying voltages inclusive of the j-th voltage. At this time, a set of voltages ($V_{FB1}$, $V_{FB2}$, $V_{FBj}$, , , $V_{FBn}$) satisfying the following condition even with varying $V_j$ is called a flat band voltage.

$$C_{acc}^j(V_{FB1}, V_{FB2}, , V_{FBj} + V_j, , V_{FBn}) = \frac{\partial Q_0(0, 0, , , V_j, , 0)}{\partial V_j} \quad (40)$$

Although an accumulative layer capacity to be compared may be obtained by one single value of j, more accurate flat band voltage is determined by comparing the formula with respect to plural values of j.

To briefly explain major benefits of the present invention, it makes it possible to measure the dependency of mobility of a transistor having plural gates on surface roughness scattering. In addition, it enables to extract a device parameter for roughness scattering of a transistor having plural gates. Further, it inputs the extracted device parameter to a circuit simulator. Accordingly, it is now possible to provide a circuit simulator for a circuit device using any industry leading transistor with plural gates.

Additional aspects and/or advantages of the invention will be set forth in part in the description which follows and, in part, will be obvious from the description, or may be learned by practice of the invention.

DETAILED DESCRIPTION OF THE PREFERRED EMBODIMENT

Figure 1:
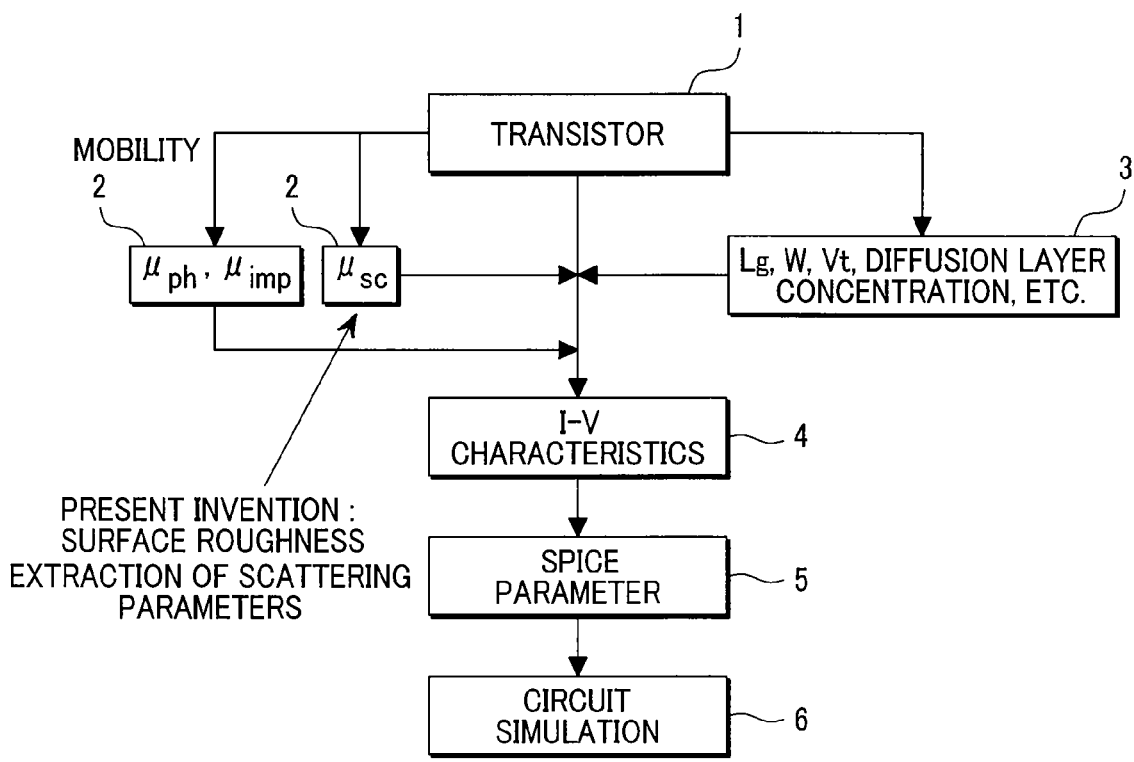
FIG. 1 is a flow chart explaining a procedure from extraction of a roughness scattering device parameter to input it to a circuit simulator, according to one embodiment of the present invention.
Figure 2:
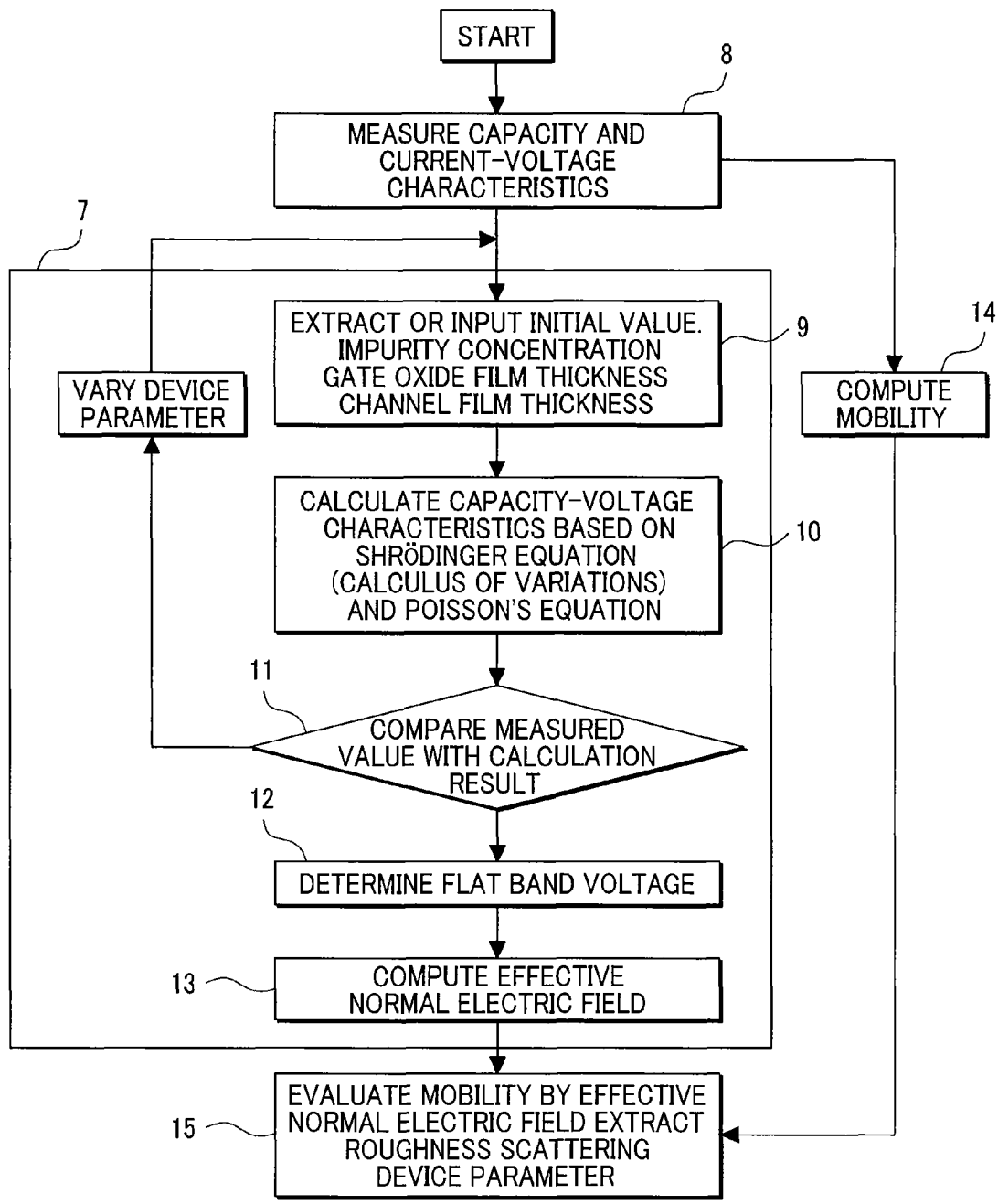
FIG. 2 is a flow chart explaining a procedure from measurement and numerical calculations to extraction of a roughness scattering device parameter.
Figure 3:
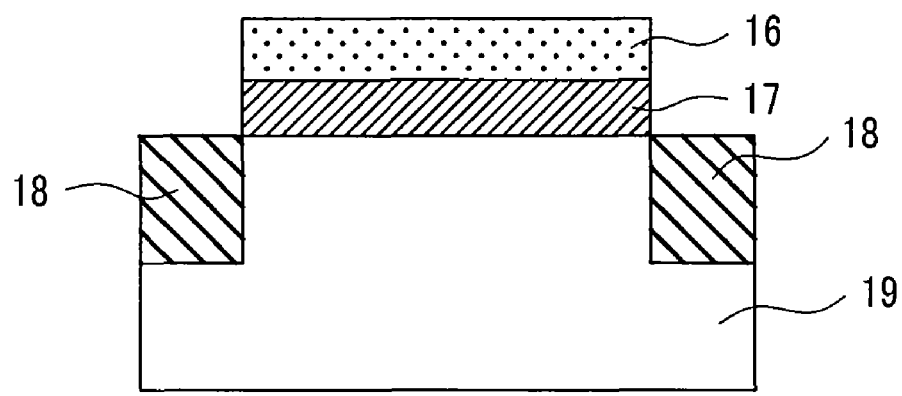
FIG. 3 is a cross-sectional schematic view of a bulk transistor.
Figure 4:
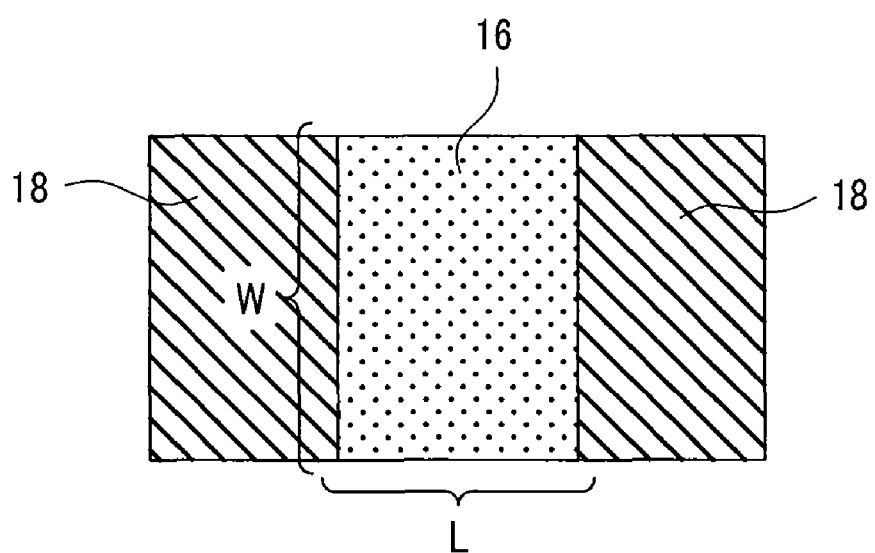
FIG. 4 is a planar schematic view of the bulk transistor in FIG. 3, which is seen from the top of the transistor.
Figure 5:
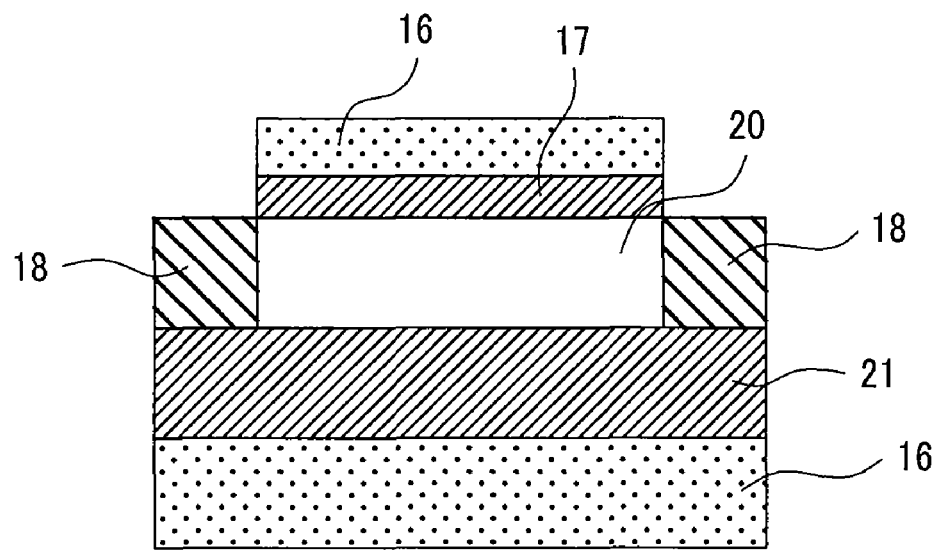
FIG. 5 is a cross-sectional schematic view of a transistor having plural gates, which is seen in a direction parallel to the source-drain direction of the transistor.
Figure 6:
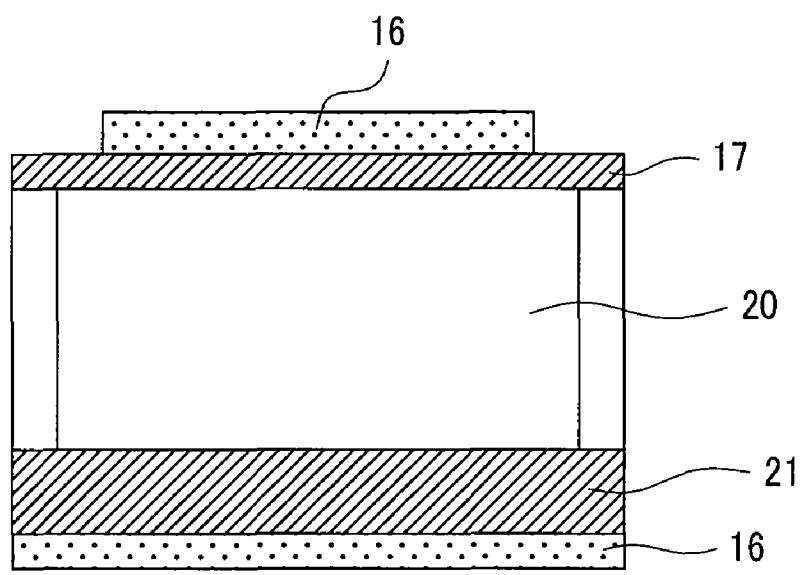
FIG. 6 is a cross-sectional schematic view of a transistor having two gates, which is seen in a direction normal to the source-drain direction of the transistor.

Whenever circumstances require it for convenience in the following embodiments, the subject matter will be described by being divided into plural sections or embodiments. However, unless otherwise specified in particular, they are not irrelevant to one another. One thereof has to do with modifications, details and supplementary explanations of some or all of the other.

When reference is made to a number of elements or the like (including the number of pieces, numerical values, quantity, range, etc.) in the description of the following embodiments, the number thereof is not limited to a specific number and may be greater than or less than or equal to the specific number, unless otherwise specified in particular and definitely limited to the specific number in principle.

It is also needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Those elements having the same function in all the drawings are respectively identified by the same reference numerals and their repetitive description will therefore be omitted. Also, drawings are provided for illustrative purposes, so a relation between thickness and planar size or a thickness ratio of each layer should be decided in reference to the description set forth hereafter.

The embodiments are chosen and described for purposes of illustration and description of technical features of the present invention. Therefore, the technical features of this invention are not defined by materials of constituent elements, shapes, structures, configuration, drive voltages, and so on.

Embodiment 1

Figure 12:
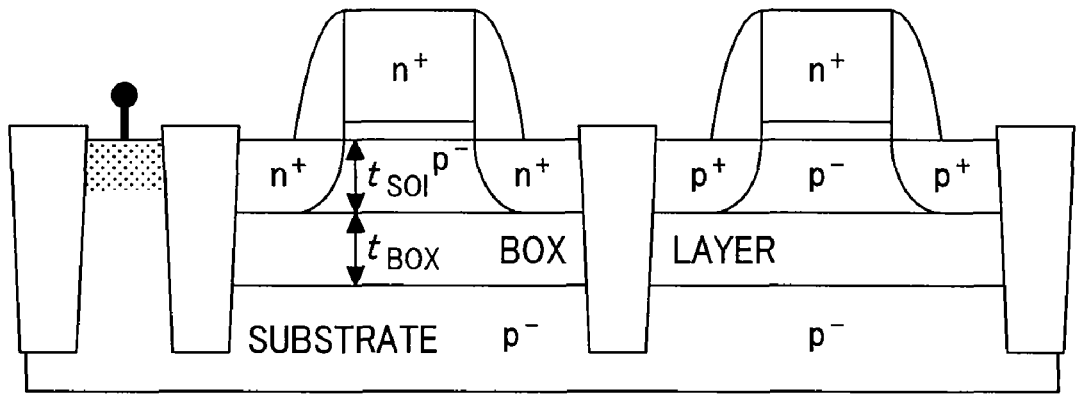
FIG. 12 is a cross-sectional schematic view of an SOTB transistor used for extraction of a roughness scattering device parameter.
Figure 13:
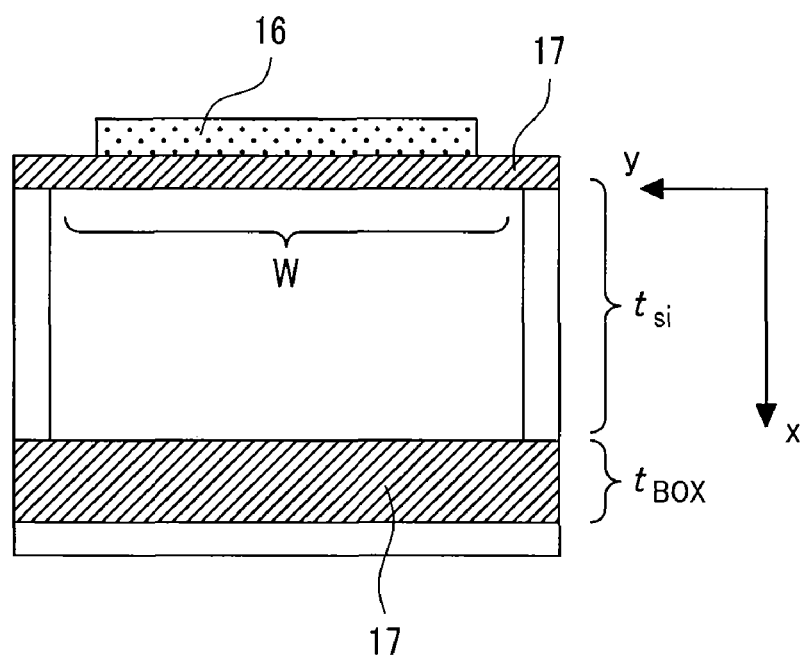
FIG. 13 is a cross-sectional schematic view of an SOTB transistor, which is seen in a direction normal to the source-drain direction of the transistor.

An application of the present invention to an SOTB transistor, a kind of double gate transistors (n=2), will now be explained. FIG. 12 and FIG. 13 respectively illustrate a Silicon On Thin Buried Oxide (abbreviated to as "SOTB") transistor. This transistor is a kind of Silicon On Insulator transistors where channel and silicon substrate are isolated by an insulation layer, and is characterized in that an insulating film on a back gate electrode side is as thin as 10 nm and that a channel is formed on a front gate side to utilize the back gate for control of $V_1$. Therefore, only an effective normal electric field seen from the front gate side is extracted. Particularly, plane orientation of silicon in a direction normal to a gate is called a (100) plane.

Suppose that $V_{G1}$ and $Q_1$ are gate voltage and charge on the front gate side, $V_{G2}$ and $Q_2$ gate voltage and charge on the back gate side, $Q_0$ channel charge, and $Q^1_{inv}$ and $Q^1_{acc}$ charge at an inversion layer and an accounting layer, respectively. Then, $E^1_{eff}$ can be written as follows:

$$E^1_{eff}(V_{G1}, V_{G2}) = \frac{1}{\varepsilon_{si}}\left(-Q_1(V_{G1}, V_{G2}) - \frac{1}{2}Q^{inv}_1(V_{G1}, V_{G2})\right) \quad (41)$$

In the equation, $Q_1(V_{G1}, V_{G2})$ is given by the following formula:

$$Q_1(V_{G1}, V_{G2}) = \int_{V_{FB1}}^{V_{G1}} dV_1 \frac{\partial Q_1(V_1, V_{FB2})}{\partial V_1} + \int_{V_{FB2}}^{V_{G2}} dV_2 \frac{\partial Q_1(V_{G1}, V_2)}{\partial V_2} \quad (42)$$

Substituting Eq. (12) and Eq. (15) into the formula to obtain:

$$Q_1(V_{G1}, V_{G2}) = -\int_{V_{FB1}}^{V_{G1}} dV_1 \left(\frac{\partial Q_0(V_1, V_{FB2})}{\partial V_1} + \frac{\partial Q_2(V_1, V_{FB2})}{\partial V_1}\right) + \int_{V_{FB2}}^{V_{G2}} dV_2 \frac{\partial Q_2(V_{G1}, V_2)}{\partial V_1} \quad (43)$$

Therefore, it is sufficient to carry out capacity measurement at a front gate High terminal only.

Meanwhile, an inversion layer capacity and an accumulation layer capacity are given as follows:

$$Q^1_{inv}(V_{G1}, V_{G2}) = \int_{V_{min}}^{V_{G1}} dV_1 \frac{\partial Q_0(V_1, V_{G2})}{\partial V_1} \quad (44)$$

The following will now explain numerical calculations $$Q^1_{acc}(V_{G1}, V_{G2}) = \int_{V_{G1}}^{V_{min}} dV_1 \frac{\partial Q_0(V_1, V_{G2})}{\partial V_1} \quad (45)$$

involved in the determination of a flat band voltage. A numerical calculation method used for a double gate transistor is described in, for example, IEEE Transactions on Electron Devices, Vol. 49, p 287, 2002, applying the method to a DG MOSFET, which has uniform thickness insulating layers for a front gate and a back gate and which is free from gate depletion effects.

These conventional techniques are not sufficient to determine a flat band voltage because they do not consider a situation where different voltages may be impressed to the front and back gates or a situation where a transistor is not free from the occurrence of gate depletion effects. In this regard, the present invention suggests that Poisson's equation in a channel region and an equation incorporating the depletion effects in a back gate side should be added. Referring to FIG. 13, 'x' indicates a direction normal to a front gate, and 'y' indicates a direction parallel thereto. Also, suppose that a transistor selected for extraction of a device parameter is much greater in y direction than x, and that an electrostatic potential and a wave function with respect to this direction are constant.

At this time, Poisson's equation has the following solutions:

$$\varphi = \frac{Q_2}{\varepsilon_{si}}x + \frac{Q_0}{\varepsilon_{si}}\left[x\int_x^{t_{si}}|\psi|^2 dx' + \int_0^x x'|\psi|^2 dx'\right] + N_{imp}\frac{x}{2}(1-x/t_{si}) + \frac{Q_1}{\varepsilon_{OX}}t_{OX} - V_1 \quad (46)$$

where $\varepsilon_{ox}$ is a dielectric constant of silicon dioxide, and $t_{ox}$ is a gate insulating film for a front gate. Further, gate depletion effects may be expressed by Eq. (25). A wave function may be expressed in a variation wave function as follows:

$$\psi(x) = Ax(1-x/t_{si})e^{-\lambda x}, 0 \leq x \leq t_{si} \quad (47)$$

Since we had assumed that an inversion layer or an accumulation layer was formed at either a front gate or a back gate, only one kind of variation parameters ($\lambda$) is considered in the above equation.

Two kinds of capacities, i.e., capacity against varying back gate voltages and capacity against varying front gate voltages, are measured, and charges at front and back gate voltages of $V_{fg}$ and $V_{bg}$ are calculated by equations below.

Figure 14:
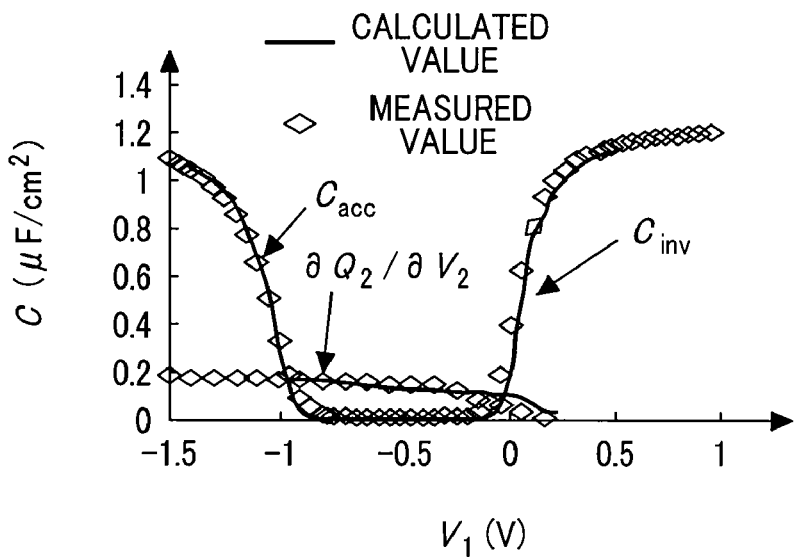
FIG. 14 is a comparative diagram of measured values vs calculated values of an inversion layer capacity ($C_{inv}$) accumulation layer capacity ($C_{acc}$), and back gate electrode side capacity in an SOTB transistor.

Thusly calculated values for inversion layer capacity ($C_{inv}(V_{G1}, V_2)$), accumulation layer capacity ($C_{acc}(V_{G1}, V_2)$), and back gate electrode capacity ($\partial Q_1(V_{G1}, V_2)/\partial V_2$) are plotted on a graph as shown in FIG. 14. Through comparison with an actual measurement value of the accumulation layer capacity, one may discover that a flat band voltage ($V_{FB1}$, $V_{FB2}$)=

Figure 15:
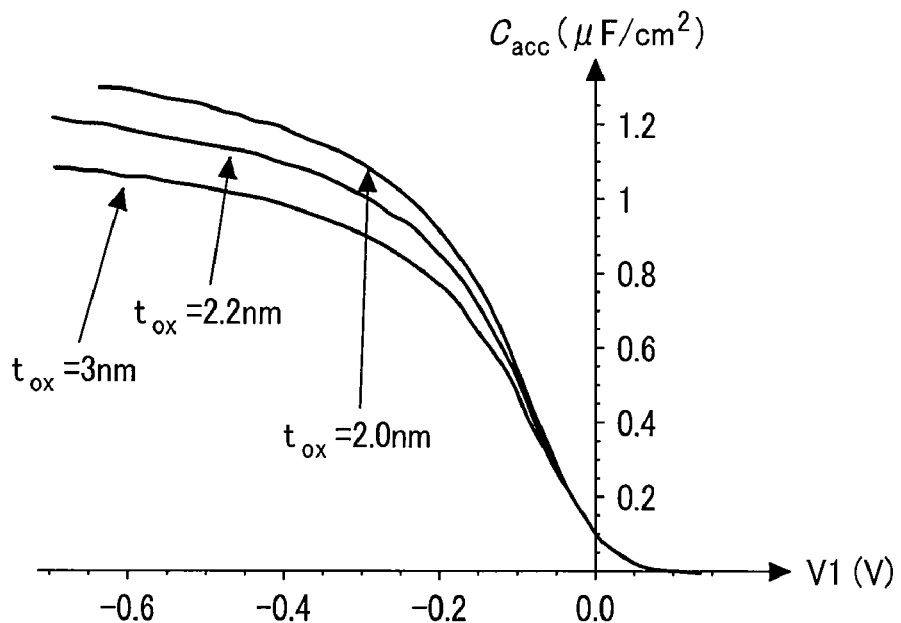
FIG. 15 graphically shows an accumulation layer capacity against varying front gate oxide thicknesses ($t_{ox}$) of an SOTB transistor.
Figure 16:
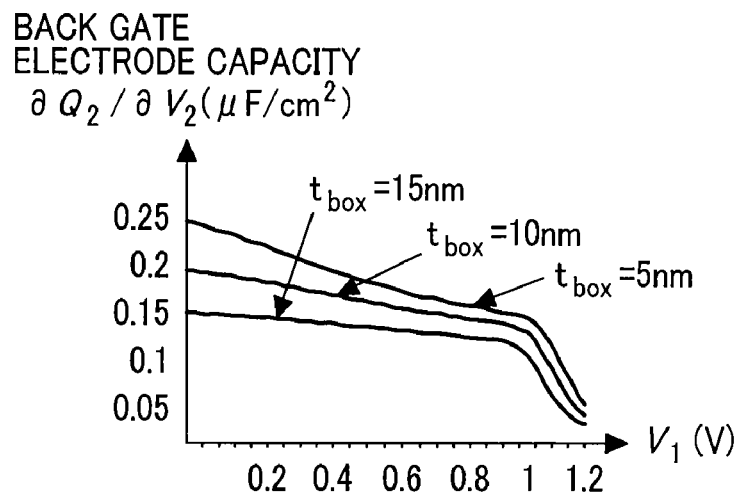
FIG. 16 graphically shows an electrode side capacity against varying front gate oxide thicknesses ($t_{ox}$) of an SOTB transistor.
Figure 17:
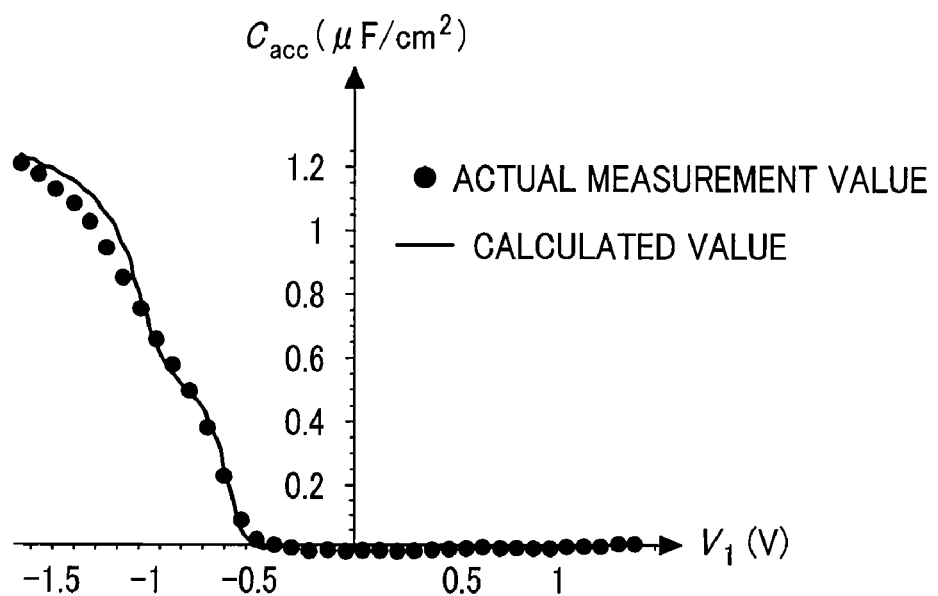
FIG. 17 is a comparative diagram of measured values and calculated measures of an accumulation layer capacity against varying front gate voltages, assuming that a constant voltage of −1.0V is impressed to the back gate electrode of an SOTB transistor.
Figure 18:
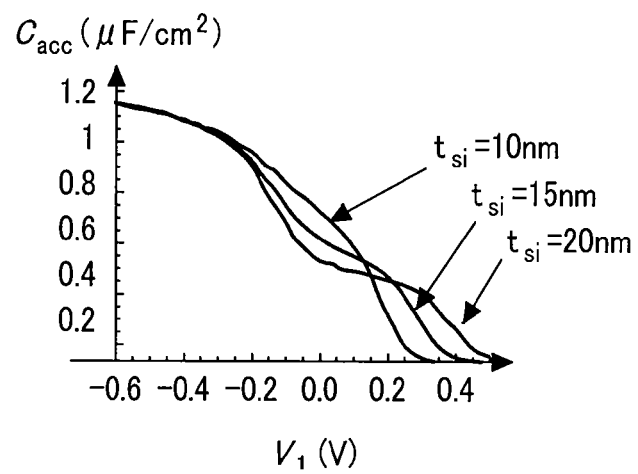
FIG. 18 graphically shows calculated values of an accumulation layer capacity against varying front gate voltages, assuming that voltages of diverse levels are applied to the back gate electrode of an SOTB transistor.

(−0.9V, 0.1V). In FIG. 15, $C_{acc}(V_{G1},V_2)$ are plotted against varying $t_{ox}$ and $t_{box}$. From the accumulation layer capacity given in FIG. 15, one can extract a thickness of a front gate oxide $t_{ox}=2.2$ nm. FIG. 16 shows calculated values of $\partial Q_1(V_{G1},V_2)/\partial V_2$, from which one may learn an actual measurement value of capacity coincides with a calculated value of capacity when $t_{box}=10$ nm. FIG. 17 and FIG. 18 respectively show accumulation layer capacities, provided that $V_2=-1$V. From the graphs, one may learn that a calculated value of capacity coincides with an actual measurement value of capacity when $t_{si}=15$ nm. Therefore, it has been proved that a structural parameter can be extracted by comparing calculations of gate electrode capacity in the back gate side with calculations of accumulation layer capacity.

Figure 19:
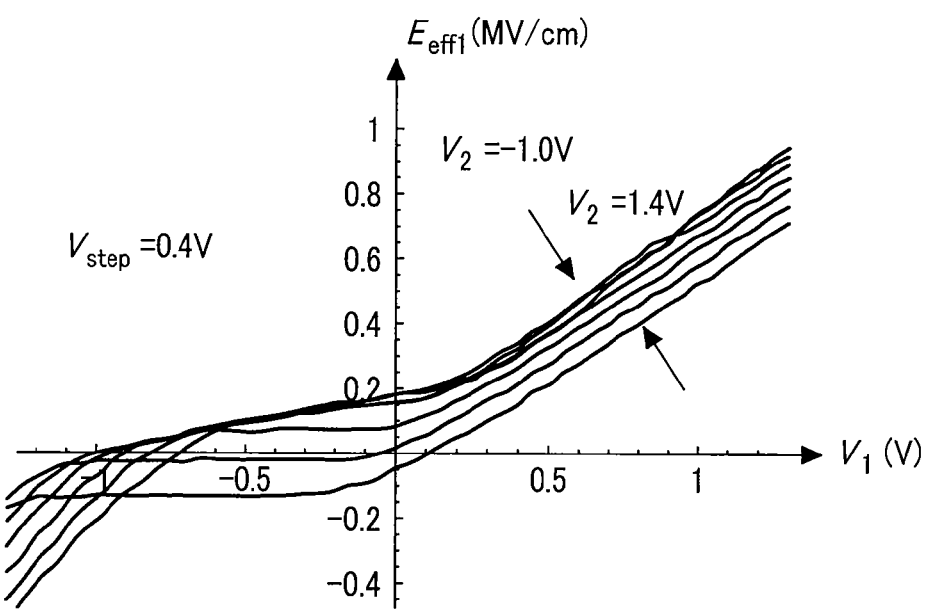
FIG. 19 graphically shows effective normal electric fields ($E_{eff}^1$) on a front gate side against varying front gate voltages, assuming that voltages of diverse levels are applied to the back gate electrode of an SOTB transistor.

FIG. 19 shows an effective normal electric field ($E_{eff}^1$) computed from the charge that has been extracted through capacity measurement and flat band voltage calculation described above. In FIG. 19, effective normal electric fields are plotted against a varying front gate voltage ($V_1$), while assuming that a back gate voltage ($V_2$) is fixed. It should be noted that there is a region where the effective normal electric field becomes negative. An effective normal electric field is always defined as positive for bulk transistors, but a negative effective normal electric field in FDSOI transistors is analyzed as follows:

To rewrite $E_{eff}^1$ according to the definition given in Eq. (8), $$E_{eff}^1=(Q_2+Q_0-(1-\eta)Q_{inv}^j)/\in_{si} \quad (48)$$

In Eq. (42), an inversion layer capacity in the front gate side and an inversion layer capacity in the back gate side are equally notated as $Q_{inv}$, and $Q_0$ is decomposed into inversion layer charge and depletion layer charge, i.e., $Q_0=Q_{inv}+Q_{dep}$, to yield $$E_{eff}^1=-(-Q_2-\eta Q_{inv})/\in_{si}+Q_{dep}/\in_{si} \quad (49)$$

In Eq. (43), if a channel impurity concentration is low and depletion capacity inside the channel is small, $E_{eff}^1=-E_{eff}^2$ for an NMOSFET. Therefore, a negative effective normal electric field in the front gate side is analyzed as a positive effective normal electric field in the back gate side.

Figure 20:
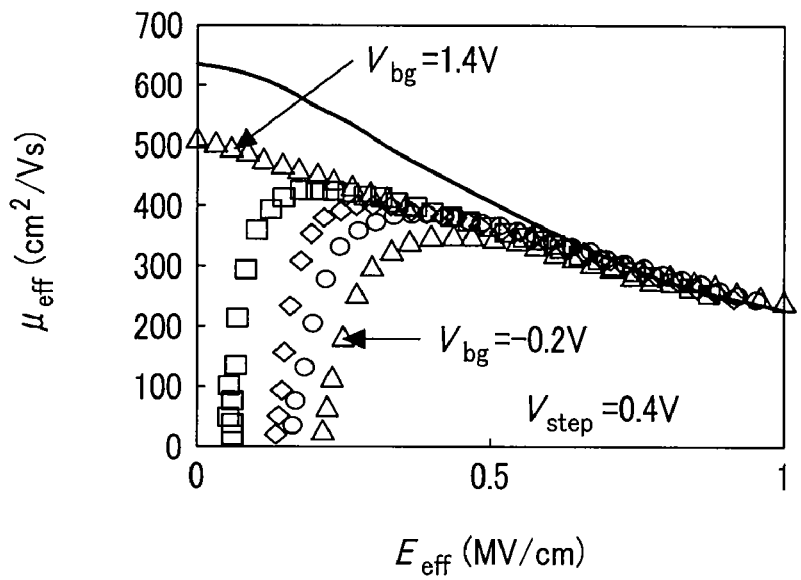
FIG. 20 graphically shows effective mobility plotted as a function of the effective normal electric field ($E_{eff}^1$) on a front gate side against varying front gate voltages, assuming that voltages of diverse levels are applied to the back gate electrode of an SOTB transistor.
Figure 21:
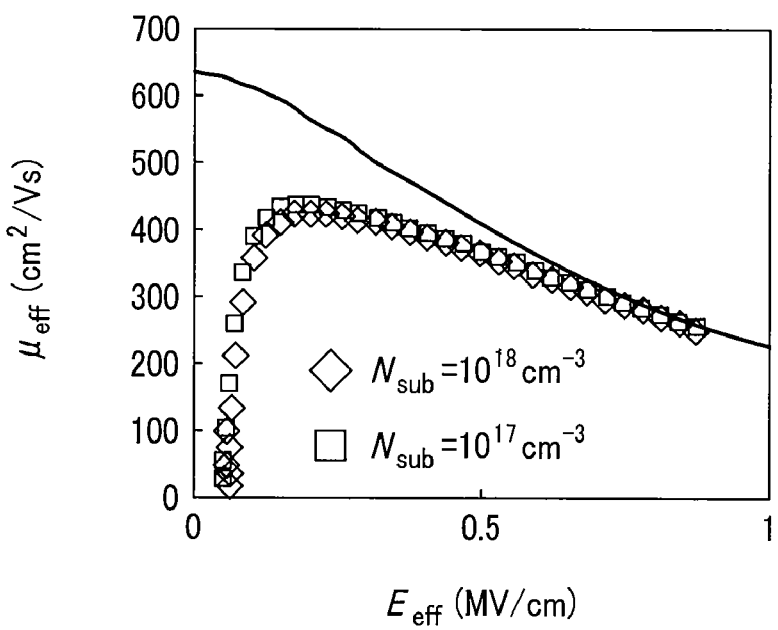
FIG. 21 graphically shows effective mobility plotted as a function of the effective normal electric field ($E_{eff}^1$) on a front gate side against varying front gate voltages, assuming that a back gate voltage is set to 0V for an SOTB transistor with two different impurity concentrations at a back gate of an SOTB transistor.
Figure 22:
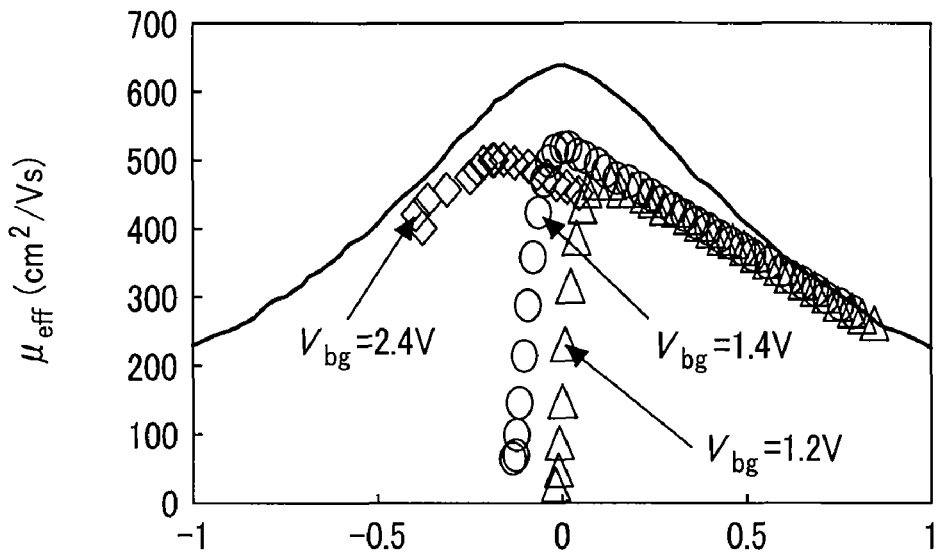
FIG. 22 graphically shows effective mobility plotted as a function of the effective normal electric field ($E_{eff}^1$) on a front gate side against varying front gate voltages, assuming that 2.4V is impressed to the back gate electrode of an SOTB transistor to form an inversion layer on the back gate side.

In FIGS. 20, 21, and 22, effective mobilities are plotted as a function of the effective normal electric field as defined as above. In these graphs, dotted lines indicate measured values, and solid lines indicate universal mobility curves in bulk transistors. In particular, FIG. 20 shows effective mobility plotted against the variation of voltages from $V_2$ to $V_1$. These curves come up with a parabola, from which a device mobility parameter is extracted. Here, because $V_2$ corresponds to $V_{bg}$ in the graph(s), and $E_{eff}$ in the graph(s) is determined by $V_1$ and $V_2$, a change in $V_1$ corresponds to a change in $E_{eff}$.

FIG. 21 shows effective mobility plotted against two levels of impurity concentrations at the back gate. As can be seen from the graph, the smaller the impurity concentration at the back gate is, the less the effective normal electric field becomes.

FIG. 22 shows a mobility curve after 2.4V ($V_2=2.4$V) is applied to a back gate to form an inversion layer in the back gate side. Accordingly, it becomes possible to extract a roughness scattering device parameter at an insulating film in the back gate side.

Figure 23:
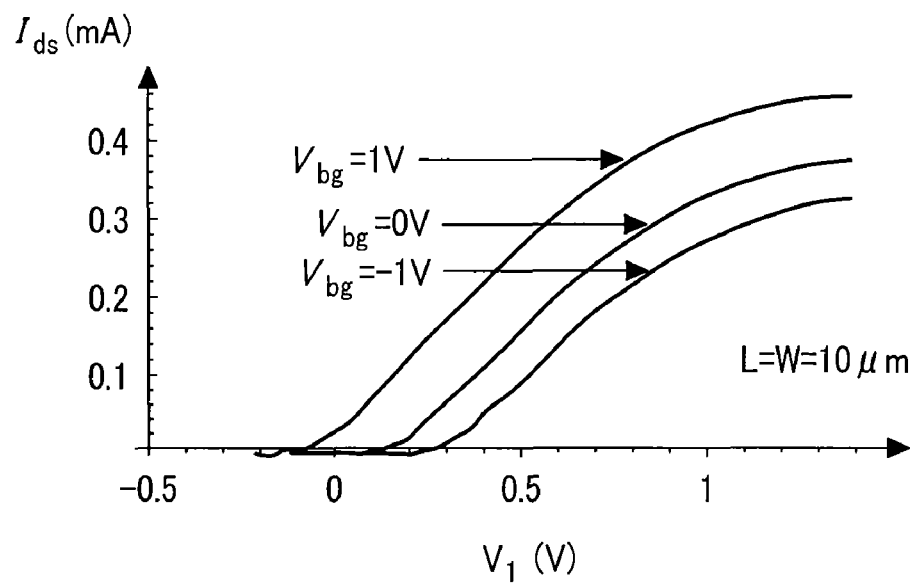
FIG. 23 is a graph showing I-V characteristics between source and drain of an SOTB transistor (L=W=10 μm), which are calculated based on a roughness scattering device parameter as extracted according to the present invention.

FIG. 23 shows a source-to-drain current calculated by Eq. (1) on the basis of the extracted roughness scattering device parameter. The I-V characteristics are inputted and utilized for a circuit simulator. With this procedure having been explained so far, an operation waveform of a ring oscillator 51's inverters was reproduced.

Embodiment 2

Figure 7:
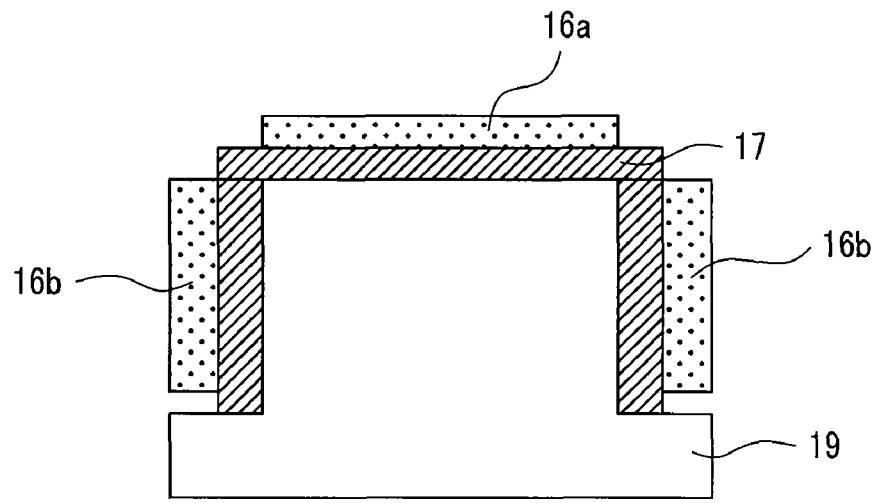
FIG. 7 is a cross-sectional schematic view of a transistor having three gates, which is seen in a direction normal to the source-drain direction of the transistor.

For a transistor like the one shown in FIG. 7, which has three gates and a channel region thereof is in direct contact with a substrate, Fang-Howard variation wave function ($\Psi(x)=Axe^{-\lambda x}$, ($0 \leq x \leq \infty$) and a calculation method for a bulk transistor are applied, given that a voltage is impressed to a gate 16a of FIG. 7. On the other hand, if a voltage is impressed to a gate 16b, calculation methods explained in Eq. (46) and Eq. (47) for a double gate transistor are applied. In result, an equation for a current-voltage curve is obtained identically to Embodiment 1, and an operation waveform of a ring oscillator 51's inverters was reproduced.

Embodiment 3

Figure 8:
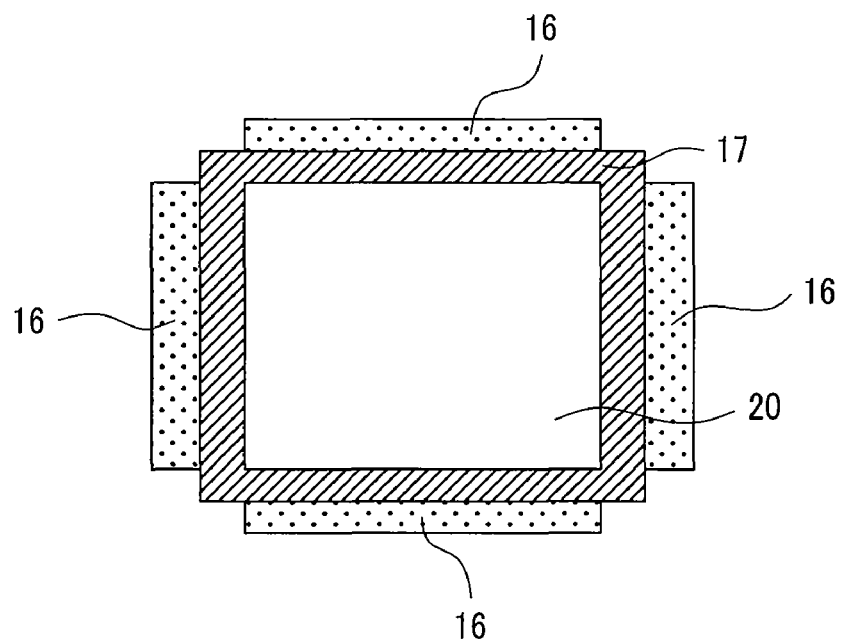
FIG. 8 is a cross-sectional schematic view of a transistor having four gates, which is seen in a direction normal to the source-drain direction of the transistor.
Figure 9:
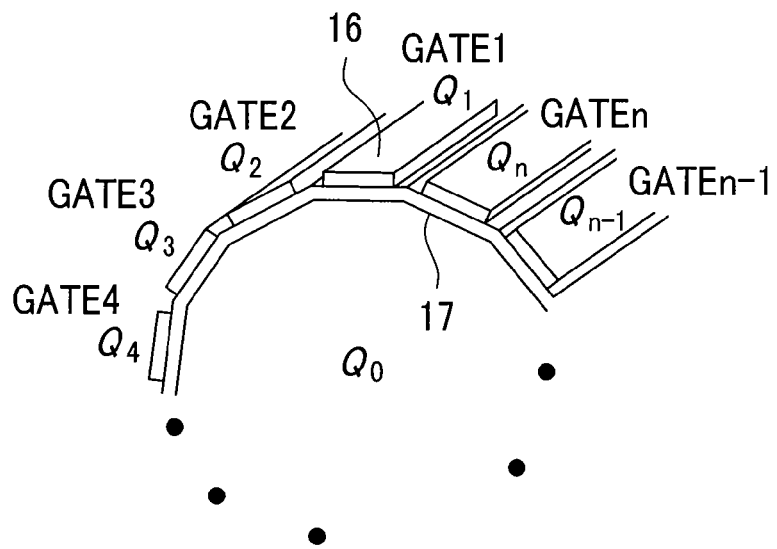
FIG. 9 is a cross-sectional schematic view of a transistor having 'n' gates, which is seen in a direction normal to the source-drain direction of the transistor.
Figure 10:
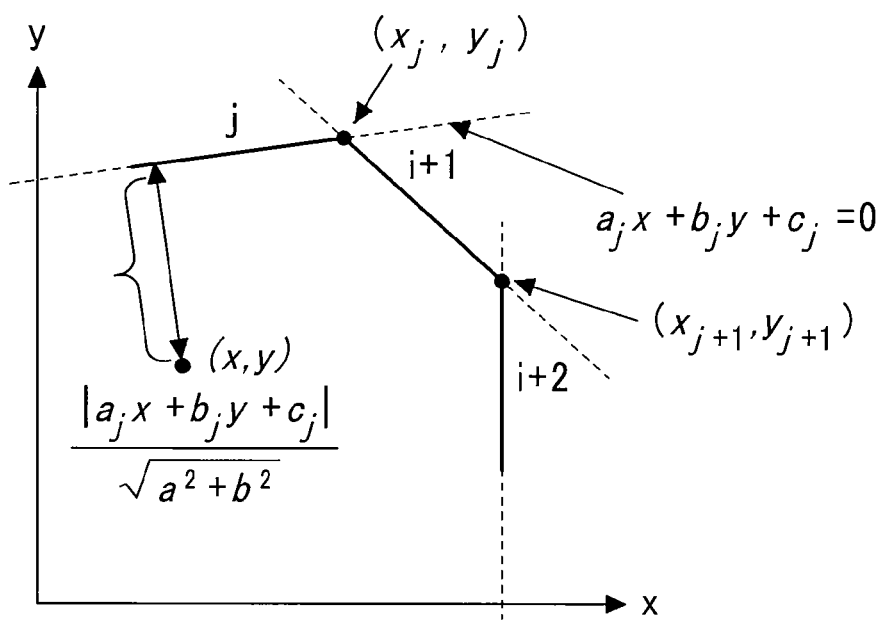
FIG. 10 is a drawing of a cross-section of the transistor having 'n' gates, which is seen in a direction normal to the source-drain direction of the transistor, is plotted on a 2-dimensional coordinate grid.
Figure 11:
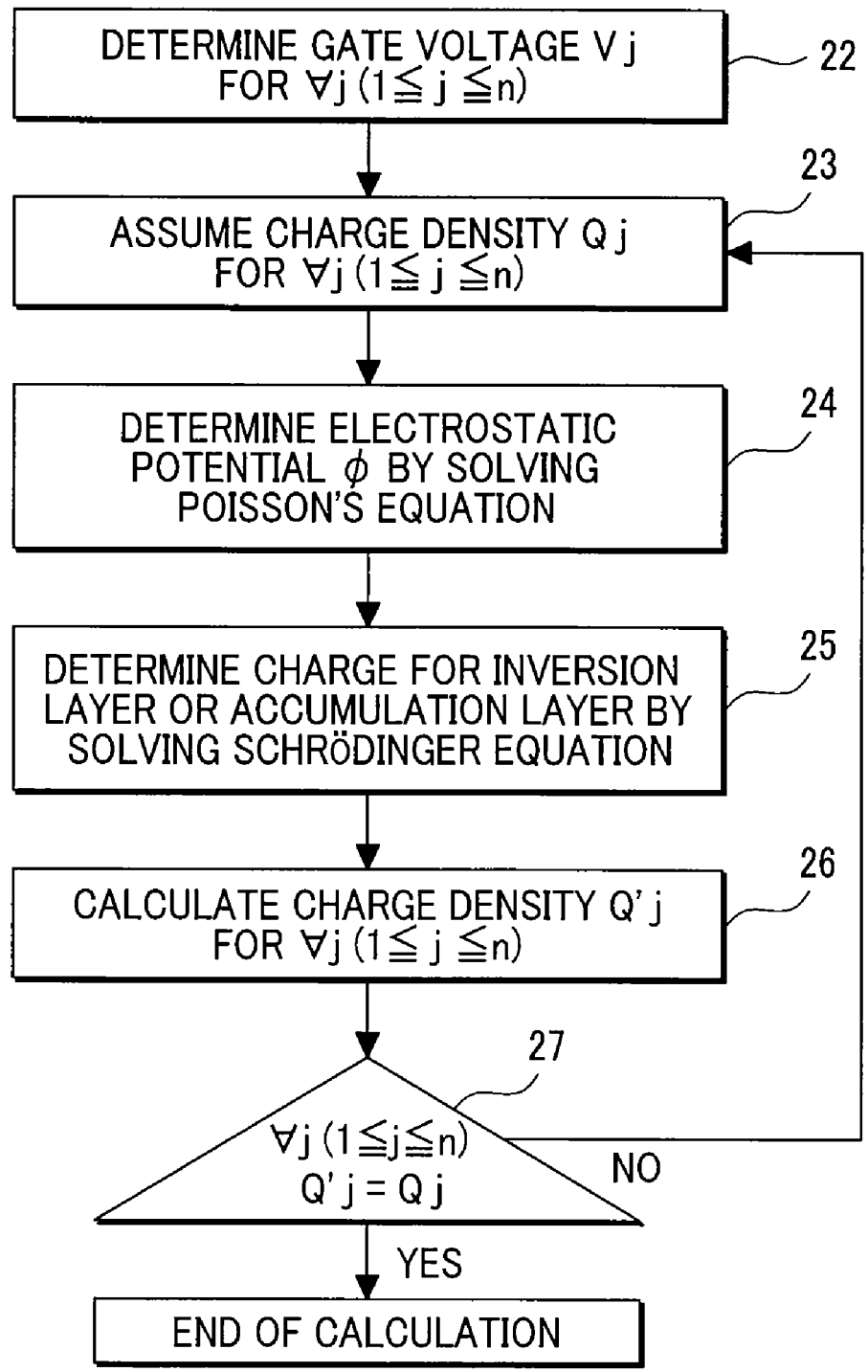
FIG. 11 is a flow chart explaining a procedure of numerical calculations of charge density inside a transistor having plural gates.

For a transistor having four gates like the one shown in FIG. 8, calculation methods explained in Eq. (46) and Eq. (47) for a double gate transistor are applied, provided that only voltage between two opposite gates is varied, and a flat band voltage is applied to the other gates. In addition, in case of applying voltages to four gates simultaneously, a wave function may be written as follows, obeying in Eq. (29):

$$\psi(x,y) = Ax\left(1-\frac{x}{t_{si}^1}\right)y\left(1-\frac{y}{t_{si}^2}\right)e^{\lambda_1 x + \lambda_2 y} (0 \leq x \leq t_{si}^1, 0 \leq y \leq t_{si}^2) \quad (50)$$

where $t_{si}^1$ and $t_{si}^2$ stand for distances between two opposite gates. Other parameters have the same meaning as those in Eq. (29). Substituting Eq. (17) into the following formula yields capacity at a j-th gate (j=0, 1, 2, 3, 4) or a channel:

$$Q_j(V_{G1}, V_{G2}, V_{G3}, V_{G4}) = \int_{V_{FB1}}^{V_{G1}} dV_1 \frac{\partial Q_j(V_1, V_{FB2}, V_{FB3}, V_{FB4})}{\partial V_1} + \quad (51)$$
$$\int_{V_{FB2}}^{V_{G2}} dV_2 \frac{\partial Q_1(V_{G1}, V_2, V_{FB3}, V_{FB4})}{\partial V_2} +$$
$$\int_{V_{FB3}}^{V_{G3}} dV_3 \frac{\partial Q_j(V_{G1}, V_{G2}, V_3, V_{FB4})}{\partial V_3} +$$
$$\int_{V_{FB4}}^{V_{G4}} dV_4 \frac{\partial Q_1(V_{G1}, V_{G2}, V_{G3}, V_4)}{\partial V_4}$$

In result, an equation for a current-voltage curve is obtained identically to Embodiment 1, and an operation waveform of a ring oscillator 51's inverters was reproduced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A design method for a semiconductor circuit, for extraction of semiconductor circuit characteristics, having a field-effect transistor, the transistor including plural gate electrodes provided in a periphery portion of a channel section and gate insulating films sandwiched between the plurality of gate electrodes and the channel section, the method comprising the steps of:

providing a device-circuit simulator;

calculating capacity-voltage characteristics in a direction normal to each of the gate insulating films provided onto the channel section;

obtaining a flat band voltage of the field-effect transistor by making use of the calculated capacity-voltage characteristics and premeasured capacity-voltage characteristics of the respective gate insulating films;

calculating an effective normal electric field by making use of measured values of an inversion layer capacity, an accumulation layer capacity, and a depletion layer capacity of the field-effect transistor, and of the flat band voltage;

extracting roughness scattering mobility at a gate insulating film interface of the field-effect transistor by making use of effective mobility, which is calculated based on the inversion layer capacity and current-voltage characteristics in a source-drain path of the field-effect transistor;

inputting the extracted roughness scattering mobility to said device-circuit simulator; and performing a circuit simulation for the semiconductor circuit using said device-circuit simulator, wherein the flat band voltage is determined as a set of a plurality of voltages corresponding to the plurality of gate insulating films and to each gate electrode, through comparison of an actual measurement value in an accumulation layer capacity of an accumulated transistor that is prepared in advance for measurement with the calculated capacity-voltage characteristics.

2. The method according to claim 1, wherein the calculation step of capacity-voltage characteristics includes:

incorporating a quantum effect with an electron or hole wave function in a direction normal to the respective gate insulating film; and making a classical approximation for a gate depletion effect at a gate block of the field-effect transistor.

3. The method according to claim 1, wherein, for extraction of semiconductor circuit characteristics, two opposite gate electrodes among the plurality of gate electrodes, two gate insulating films provided respectively in contact with the gate electrodes, and a channel section sandwiched therebetween are used, a comparison process is carried out based on an accumulation layer capacity obtained by measuring an accumulated transistor prepared in advance for measurement, an inversion layer capacity obtained by measuring an inverted transistor prepared in advance for measurement, a gate depletion capacity in one of the two gate electrodes, and a calculated value of capacity characteristics obtained by the capacity-voltage characteristic calculation step, so as to calculate film thicknesses of the gate respective insulating films and the channel section, and said calculated film thicknesses are provided as inputs to the device-circuit simulator.

4. The method according to claim 1, further comprising, fabricating said semiconductor circuit based on results of the circuit simulation.

* * * * *